United States Patent
Chen et al.

(10) Patent No.: US 11,171,496 B2
(45) Date of Patent: Nov. 9, 2021

(54) ELECTRONIC DEVICE, BATTERY ASSEMBLY AND BATTERY PROTECTION BOARD

(71) Applicant: GUANGDONG OPPO MOBILE TELECOMMUNICATIONS CORP., LTD., Guangdong (CN)

(72) Inventors: Wei Chen, Guangdong (CN); Jialiang Zhang, Guangdong (CN); Shebiao Chen, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 170 days.

(21) Appl. No.: 16/485,732

(22) PCT Filed: Aug. 25, 2017

(86) PCT No.: PCT/CN2017/099127
§ 371 (c)(1),
(2) Date: Aug. 13, 2019

(87) PCT Pub. No.: WO2019/037111
PCT Pub. Date: Feb. 28, 2019

(65) Prior Publication Data
US 2020/0274372 A1 Aug. 27, 2020

(51) Int. Cl.
*H02J 7/00* (2006.01)
*H01M 10/42* (2006.01)
*H01M 10/48* (2006.01)

(52) U.S. Cl.
CPC ......... *H02J 7/0029* (2013.01); *H01M 10/425* (2013.01); *H01M 10/48* (2013.01);
(Continued)

(58) Field of Classification Search
USPC .......................................................... 320/134
See application file for complete search history.

(56) References Cited

U.S. PATENT DOCUMENTS

| | | | |
|---|---|---|---|
| 5,343,137 A | 8/1994 | Kitaoka et al. | |
| 2002/0041174 A1* | 4/2002 | Purkey | H02J 7/345 320/103 |

(Continued)

FOREIGN PATENT DOCUMENTS

| | | |
|---|---|---|
| CN | 101308921 | 11/2008 |
| CN | 101689684 | 3/2010 |

(Continued)

OTHER PUBLICATIONS

WIPO, ISR and WO for PCT/CN2017/099127, Jan. 5, 2018.
(Continued)

*Primary Examiner* — Mohammed Alam
(74) *Attorney, Agent, or Firm* — Hodgson Russ LLP

(57) ABSTRACT

The present disclosure provides a battery protection board, including: a body; a voltage jump detection circuit, disposed on the body, and configured to detect whether a voltage jump occurs in a voltage of a battery, and to output a voltage jump signal when a voltage jump occurs in the voltage of the battery; and a battery protection unit, coupled to an output end of the voltage jump detection circuit, and configured to determine that the battery is damaged when the voltage jump signal is received, and to protect the battery. The present disclosure also discloses a battery assembly having the above battery protection board and a terminal device having the battery assembly.

16 Claims, 6 Drawing Sheets

(52) U.S. Cl.
CPC ........ *H02J 7/00032* (2020.01); *H02J 7/0047* (2013.01); *H01M 2010/4271* (2013.01); *H01M 2010/4278* (2013.01)

(56) References Cited

U.S. PATENT DOCUMENTS

| | | | | |
|---|---|---|---|---|
| 2019/0317154 A1* | 10/2019 | Chen | ................... | G01R 31/3842 |
| 2019/0383882 A1* | 12/2019 | Chen | ...................... | G01R 19/12 |
| 2020/0274372 A1* | 8/2020 | Chen | ...................... | H01M 10/48 |
| 2020/0295575 A1* | 9/2020 | Nook | ...................... | H02J 1/122 |

FOREIGN PATENT DOCUMENTS

| | | |
|---|---|---|
| CN | 102403551 | 4/2012 |
| CN | 106537654 | 3/2017 |
| CN | 106602502 | 4/2017 |
| CN | 106680575 | 5/2017 |
| CN | 106849002 | 6/2017 |
| EP | 2911256 | 8/2015 |
| JP | 2002008631 | 1/2002 |

OTHER PUBLICATIONS

IPO Office Action for IN Application No. 201917032095, dated May 21, 2020.
EPO, Office Action for EP Application No. 17922727.7, dated Feb. 24, 2020.
SIPO, First Office Action for CN Application No. 201780003741.7, dated Feb. 19, 2021.
CNIPA, Second Office Action for CN Application No. 201780003741.7, Jul. 6, 2021.

* cited by examiner

REPLACEMENT SHEET

ELECTRONIC DEVICE, BATTERY ASSEMBLY AND BATTERY PROTECTION BOARD

CROSS-REFERENCE TO RELATED APPLICATIONS

This application is a U.S. national phase application of International Application No. PCT/CN2017/099127, filed on Aug. 25, 2017, the entire contents of which is incorporated herein by reference.

TECHNICAL FIELD

The present disclosure relates to a terminal device technology field, and more particularly, to a battery protection board, a battery assembly and an electronic device having the battery assembly.

BACKGROUND

A battery is a power source of a mobile terminal, and provides a long-term stable power supply for the mobile terminal such as a mobile phone. The earliest batteries used in mobile terminals are nickel-chrome batteries and nickel-hydrogen batteries. With the increasement of sizes and functions of screens of the mobile terminals, the capacity of nickel-chrome batteries and nickel-hydrogen batteries cannot satisfy the energy demand. Lithium batteries have many advantages, for example, high energy density and hence small size and light weight and larger capacity, quick charging and discharging, having no memory effect compared to the nickel-chrome batteries and nickel-hydrogen batteries, and minimal element damage to environment. The lithium batteries have gradually replaced the traditional nickel-chrome batteries and nickel-hydrogen batteries.

Although the lithium battery effectively solves the problem of battery capacity, it also causes safety problems. For example, when the lithium battery is damaged and becomes short-circuited, heat generates inside the battery cell. When the heat generates really fast, the battery would ignite or explode. Therefore, safety monitoring is required for the battery to prevent accidents.

In the related art, in order to ensure the safety of the battery inside the mobile terminal, it is necessary to install a battery protection board for the battery. The existing battery protection board generally performs over-charge, over-discharge, and overcurrent detection on the battery, and cannot monitor whether an abnormality occurs in the battery in real time, which is not intelligent enough.

SUMMARY

The present disclosure aims to solve one of the above problems to at least some extent.

A battery protection board provided by embodiments of a first aspect of the present disclosure includes: a body; a voltage jump detection circuit, disposed on the body, and configured to detect whether a voltage jump occurs in a voltage of a battery, and to output a voltage jump signal when a voltage jump occurs in the voltage of the battery; and a battery protection unit, coupled to an output end of the voltage jump detection circuit, and configured to determine that the battery is damaged when the voltage jump signal is received, and to protect the battery.

Embodiments of a second aspect of the present disclosure provide a battery assembly. The battery assembly includes the battery protection board described above and a battery.

Embodiments of a third aspect of the present disclosure provide an electronic device. The electronic device includes the above battery protection board, a battery, and a control system. The control system is coupled to the battery protection board, and is configured to control the electronic device to issue an alert when the battery is damaged.

DETAILED DESCRIPTION

Figure 1:
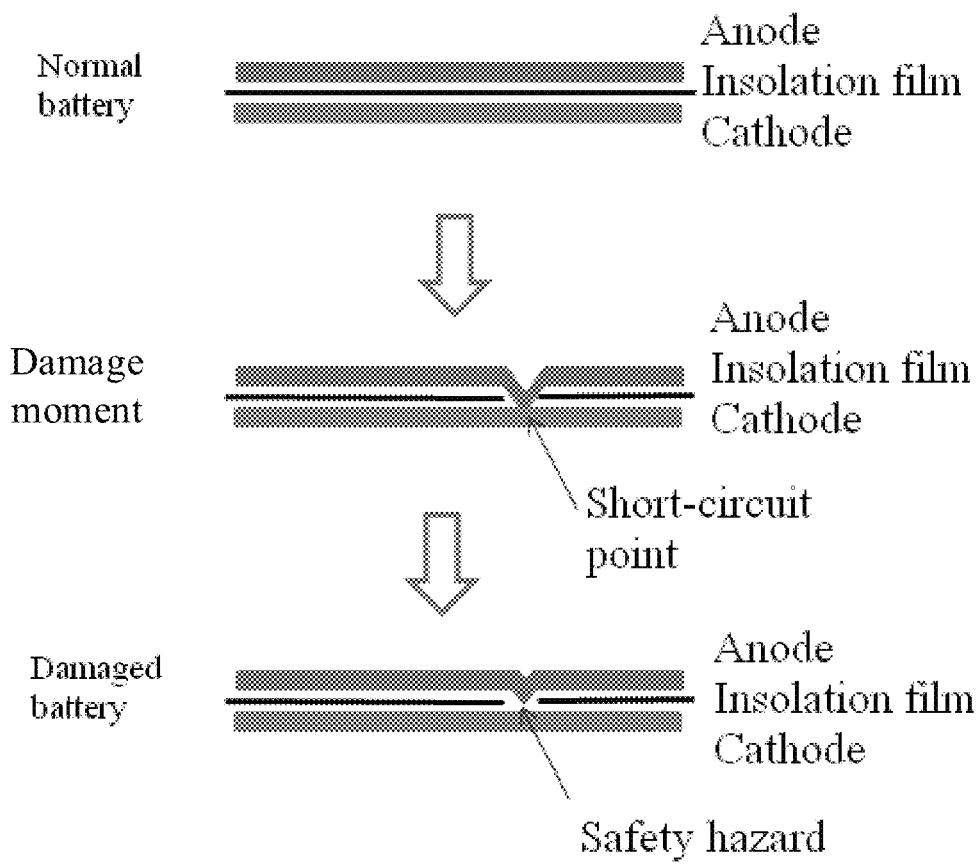
FIG. 1 is a schematic diagram of a battery damage process according to an embodiment of the present disclosure.

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure.

Before describing the battery protection board, the battery assembly, and the electronic device having the battery assembly provided by embodiments of the present disclosure, a structure of a battery generally used for the electronic device and its possible safety hazard will be described.

For example, a lithium battery mainly consists of a battery cell and a battery protection system. The battery cell is referred to as a "heart" of the lithium battery, the cell has cathode and anode materials, electrolyte, an isolation film and a casing, and the protection system of the battery is disposed externally. The cathode material of the battery cell is material including lithium molecules, such as lithium manganite and lithium cobalt oxide, and the anode material is graphite. The isolation film is disposed between the cathode and the anode of the battery. Generally, the isolation film is like a kind of paper folded repeatedly into a small battery box, and filled with cathode and anode materials and electrolyte. When charging is performed, an external electric field activates the lithium molecules in the cathode material, drives them to the anode and stores them in voids in the graphite carbon structure. The more lithium molecules are driven, the more energy is stored. When discharging is performed, the lithium ions in the anode are driven to the cathode, and turns to lithium molecules in the cathode material again, so the cycle to achieve charging and discharging of the battery.

The isolation film is mainly used to completely separate the cathode and anode materials of the cell. Once the cathode and the anode are in direct contact, an internal short circuit of the battery will occur, which brings certain safety hazards. Therefore, since a thin isolation film can be easily damaged, the isolation film should not be too thin. However, as consumers demand higher requirements for electronic devices, such as, thin and light mobile terminals, large screens and strong standby capability, manufacturers are seeking batteries with higher energy density. For example, the energy density of the battery can be improved by filling more cathode and anode materials. However, in the same volume, the more cathode and anode materials are filled, the thinner the isolation film becomes, and the isolation film is easily damaged if the battery is damaged by external impact, which leads to a short circuit.

As an example, when the battery is subjected to external mechanical damages such as crush damage, falling damage and puncturing damage, since the isolation film is thin, it is easy to cause damage to the isolation film and short circuit between the cathode and the anode, i.e., the internal short circuit in the battery. When the short circuit occurs, the battery voltage will be pulled down instantaneously, which is mainly because that a local internal short circuit point is formed inside the battery. The more seriously the battery is damaged, the more severely the voltage is pulled down.

Generally, relatively serious damage results in larger internal short-circuit area of the battery, and heat will generate continuously at the damage point, until the battery voltage drops to 0V. If the battery voltage is high, the battery may even be ignited and burned. Moreover, slight damage results in smaller internal short-circuit area of the battery, short-circuit current is formed at the short-circuit point, and since the large short-circuit current generates a large amount of heat at the short-circuit point, the short-circuit point is fused, and the battery voltage returns to the initial state. At this time, the battery may be used normally as a normal battery, but the battery already has the safety hazard, which may trigger the internal short circuit at any time during the later user, specifically as illustrated in FIG. 1. When the battery is damaged by external mechanical damages, most of the damages are slight damages, which results in temporary internal short circuit, and the internal short circuit of the battery will quickly return to the initial state. However, at this time, the isolation film has already been partially damaged. Therefore, it is generally difficult to monitor this kind of battery abnormality, and such a battery abnormality will bring certain safety risks to the electronic device.

As another example, during the charging and discharging process of the battery, lithium ions may accumulate in the cathode and the anode, and during accumulating, a dendrite will be produced as we can see that crystals grow on many things. The dendrite may become longer slowly, and in this process, it may puncture the isolation film, resulting in the internal short circuit of the battery. The above example describes the case where the battery is caused to occur the temporary internal short circuit due to external mechanical damage and then restored to the initial state. Such a case is more obvious at this time, that is, it is more likely to cause the internal short circuit of the battery again.

Once the short circuit occurs, a large amount of heat will be generated inside the battery cell during the use of the battery. This heat will vaporize the electrolyte inside the battery. If the heat is generated too fast, the gasification process will be very fast, and the air pressure inside the cell will increase. When the air pressure reaches a certain level that is unbearable for the casing, the casing will crack and cause an explosion, and the battery may also be ignited in contact with an open flame.

The higher the energy density is, the thinner the insolation film is, which results in that it is easy to damage the isolation film and further cause the safety accidents. Besides this, fast charging is also one of the main reasons for the safety hazard of the battery.

The so-called fast charging is the process in which the secondary rechargeable battery is charged quickly. For example, the charging process of the battery may include one or more of a trickle current charging phase, a constant current charging phase and a constant voltage charging phase. In the trickle current charging phase, the current feedback loop can be utilized such that the current entering the battery meets the expected charging current of the battery (e.g. the first charge current), for example, when the voltage is below 3.0V, the battery is pre-charged with a charging current of 100 mA. In the constant current charging phase, the current feedback loop can be utilized such that the current entering the battery meets the expected charging current of the battery (e.g. the second charge current, which is greater than the first charge current), for example, the charging current can vary from 0.1C to a few C for different batteries, where C refers to the battery capacity. At this stage, standard charging is generally performed with a charging current of 0.1C, and fast charging means charging at a current greater than 0.1C to complete charging in a short time. In the constant voltage charging phase, the voltage feedback loop can be utilized such that the voltage applied to both ends of the battery satisfies the expected charging voltage of the battery, for example, when the battery voltage is equal to 4.2V, the charging process enters the constant voltage charging phase with a constant voltage of 4.2V, and when the battery is gradually fully charged, the charging current will gradually decrease, and the battery is deemed to be fully charged if the charging current is less than 100 mA.

In the constant current charging phase, the charging current is relatively large, for example, 0.2C to 0.8C and sometimes even 1C, and the charging process of the battery is an electrochemical reaction process, which is accompanied by heat. A large amount of heat can be generated in a short time when the charging current is large, and if the insolation film is damaged, it is easy to cause short circuit of the cathode and the anode. Once the short circuit occurs, more heat is generated and the electrolyte is vaporized, and the air pressure inside the cell will increase. When the air pressure reaches a certain level that is unbearable for the casing, the casing will crack and causes an explosion, and the battery may also be ignited in contact with an open flame.

That is, once the battery has an internal short circuit, it indicates that the battery is abnormal, and in this case, the battery has certain safety hazards, which may cause safety accidents during use.

According to continuous research and experiments on the battery, the inventors of the present application have found that the voltage of the battery is relatively stable in normal use, however, once the battery is damaged, the short circuit may occur inside the battery, and thus the battery voltage will suddenly drop, and this voltage jump signal is very strong. The inventors have verified the existence of this voltage jump phenomenon through experiments. Therefore, according to the test results, the voltage jump signal appears once the battery is damaged.

Based on the discovery and a large number of experimental verifications, in order to effectively monitor whether the battery is damaged, to prevent the battery from safety hazards, and to further avoid safety incidents, the present disclosure provides effective safety monitoring and protection for abnormality of the battery.

The battery protection board, battery assembly and electronic device according to embodiments of the present disclosure will be described below with reference to the drawings.

It should be noted that the "electronic device" used in the embodiments of the present disclosure may include, but is not limited to, a device configured to receive/transmit communication signals via a wired connection (for example, public switched telephone network (PSTN), digital subscriber line (DSL) connection, digital cable connection, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal). The terminal configured to communicate via the wireless interface may be referred to as "wireless communication terminal", "wireless terminal" and/or "mobile terminal". Examples of a mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, Internet/Intranet access, a web browser, a note pad & address book, a calendar and/or a global positioning system (GPS) receiver, and a common laptop and/or handheld receiver, or other electronic devices including a radio phone transceiver.

Figure 2:
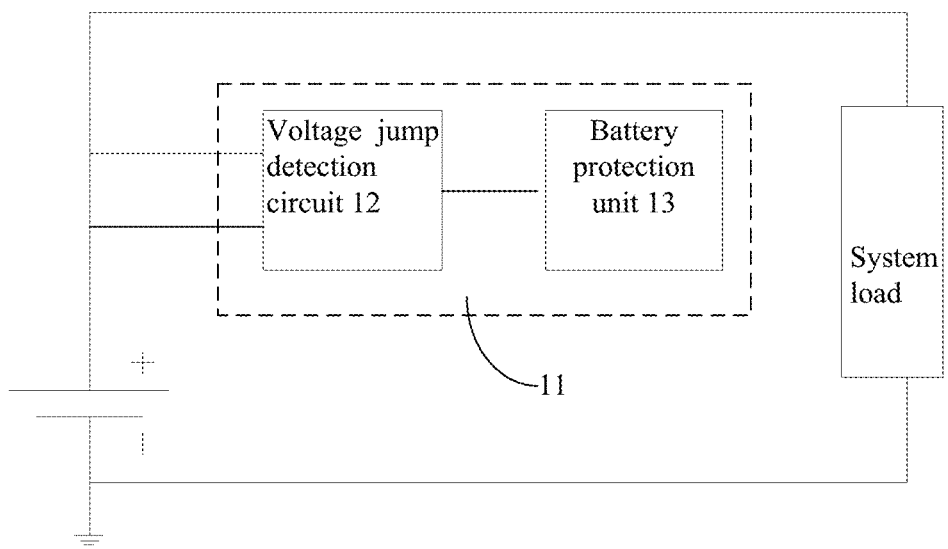
FIG. 2 is a schematic block diagram illustrating a battery protection board according to embodiments of the present disclosure.

FIG. 2 is a schematic block diagram illustrating a battery protection board according to an embodiment of the present disclosure. As illustrated in FIG. 2, the battery protection board 11 includes a body (not shown), a voltage jump detection circuit 12 disposed on the body, and a battery protection unit 13.

The voltage jump detection circuit 12 is configured to detect whether a voltage jump occurs in a voltage of a battery, and output a voltage jump signal to the battery protection unit 13 when a voltage jump occurs in the voltage of the battery. The battery protection unit 13 is coupled to the output end of the voltage jump detection circuit 12, and is configured to determine that the battery is damaged when the voltage jump signal is received, and to protect the battery, for example, by cutting off the power supply line of the battery, or by transmitting a message indicating that the battery is damaged to the electronic device and limiting the use of the battery by the electronic device, thereby realizing effective protection of the battery, and preventing safety hazards.

Figure 3:
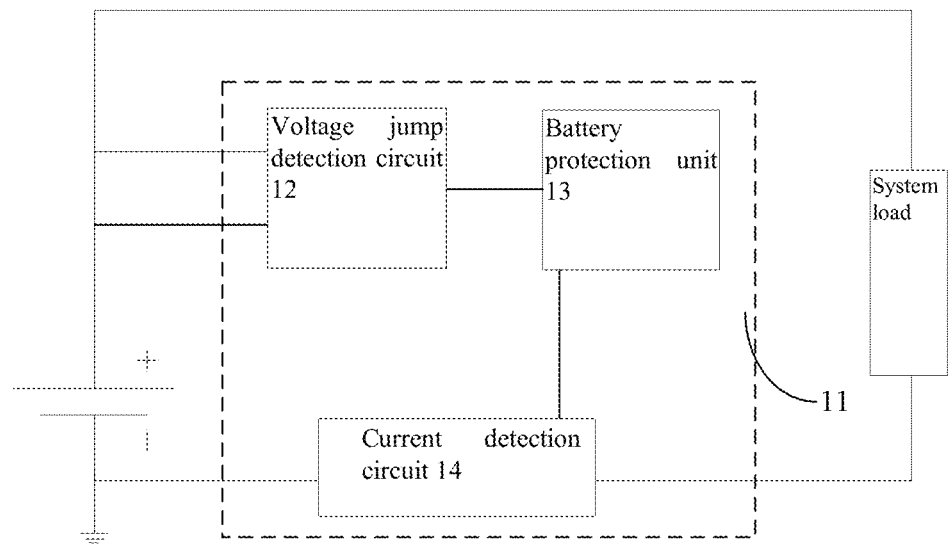
FIG. 3 is a schematic block diagram illustrating a battery protection board according to an embodiment of the present disclosure.

According to an embodiment of the present invention, as illustrated in FIG. 3, the battery protection board 11 further includes a current detection circuit 14 disposed on the body. The current detection circuit 14 is configured to detect a consumption current of the battery and to output a low current signal to the battery protection unit 13 when the consumption current of the battery is lower than a preset current threshold, such that the battery protection unit 13 determines that the battery is damaged according to the low current signal and the voltage jump signal.

That is, when the battery protection unit 13 receives both the low current signal and the voltage jump signal, it indicates that the voltage jump of the battery is the instantaneous voltage drop due to the damage of the battery, instead of the instantaneous voltage drop due to the sudden increase of the system load, and thus the detection error can be reduced and the judgment accuracy can be improved.

Figure 4:
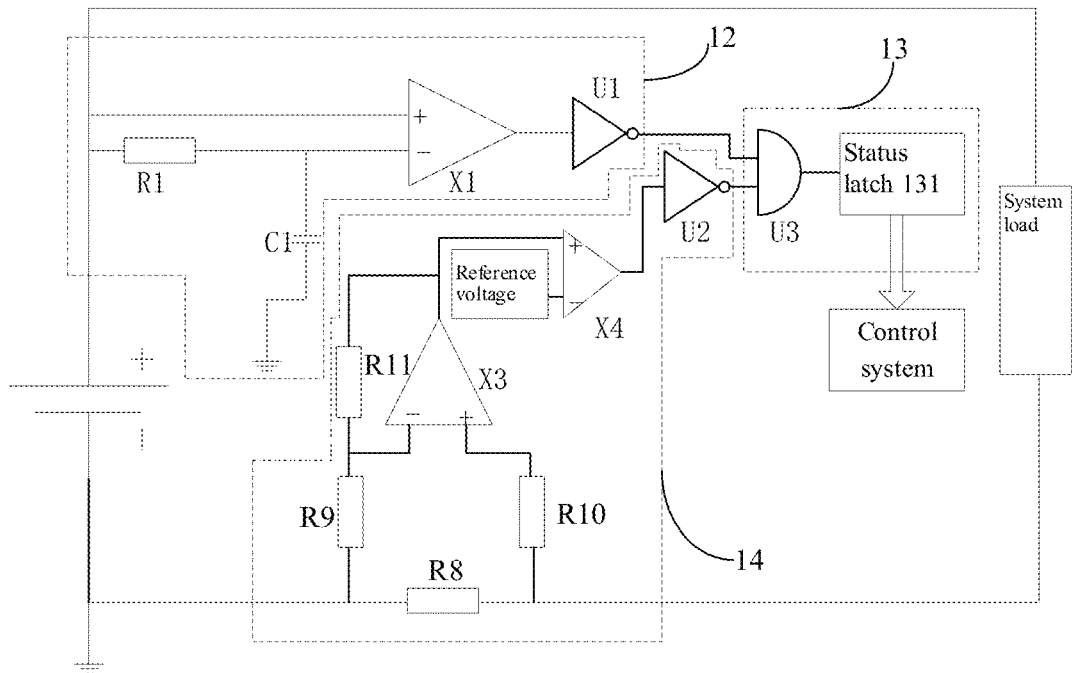
FIG. 4 is a schematic diagram illustrating a circuit of a battery protection board according to an embodiment of the present disclosure.

In an embodiment of the invention, voltage jump detection can be realized by a hardware circuit. Specifically, as illustrated in FIG. 4, the voltage jump detection circuit 12 includes a first resistor R1, a first capacitor C1, a first differential amplifier X1 and a first inverter U1. A first end of the first resistor R1 is coupled to the cathode of the battery, a first end of the first capacitor C1 is coupled to a second end of the first resistor with a first node therebetween, and a second end of the first capacitor C1 is grounded. A negative input end of the first differential amplifier X1 is coupled to the first node, and a positive input end of the first differential amplifier X1 is coupled to the cathode of the battery. An input end of the first inverter U1 is coupled to an output end of the first differential amplifier X1, and an output end of the first inverter U1 is configured as the output end of the voltage jump detection circuit 12.

Figure 5:
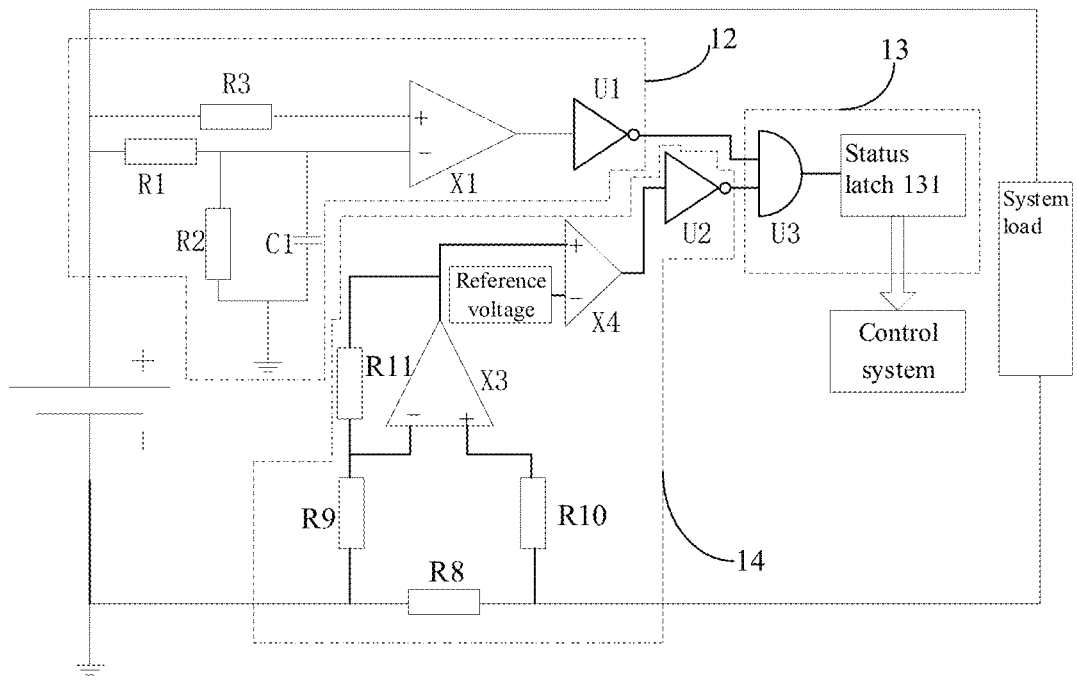
FIG. 5 is a schematic diagram illustrating a circuit of a battery protection board according to a further embodiment of the present disclosure.

Further, in order to improve reliability and detection accuracy of the circuit, as illustrated in FIG. 5, the voltage jump detection circuit 12 further includes a second resistor R2 and a third resistor R3. The second resistor R2 is coupled to the first capacitor C1 in parallel. A first end of the third resistor R3 is coupled to the cathode of the battery, and a second end of the third resistor R3 is coupled to the positive input end of the first differential amplifier X1.

When the battery is in normal use, the voltage thereof is relatively stable, the voltages of the positive input end and the negative input end of the first differential amplifier X1 remain stable, and the voltage of the positive input end of the first differential amplifier X1 is greater than the voltage of the negative input end of the first differential amplifier X1, the first differential amplifier X1 can continuously output a high level, and the first inverter U1 outputs a low level. When the battery protection unit 13 receives the low level, the battery protection unit 13 determines that the instantaneous voltage drop does not occur in the battery, and the battery is not damaged and remains in a normal state. When a voltage jump of the battery occurs, due to the presence of the first capacitor C1, the voltage of the negative input end of the first differential amplifier X1 remains constant for a certain period of time, but a voltage jump is generated on the positive input end of the first differential amplifier X1. The first differential amplifier X1 flips and outputs a low level, and the first inverter U1 outputs a high level. When the battery protection unit 13 receives the high level, the battery protection unit 13 determines that the battery voltage drops instantaneously, the battery is currently damaged, and there is an abnormality of the battery, and the battery protection unit 13 further protects the battery to prevent the safety hazard.

In an embodiment of the present disclosure, as illustrated in FIG. 4 or 5, the current detection circuit 14 includes an eighth resistor R8, a ninth resistor R9, a tenth resistor R10, a third differential amplifier X3, an eleventh resistor R11, a fourth comparator X4 and a second inverter U2. A first end of the eighth resistor R8 is coupled to the anode of the battery, a second end of the eighth resistor R8 is coupled to the cathode of the battery via a system load, and the eighth resistor R8 is a current detection resistor. A first end of the ninth resistor R9 is coupled to the first end of the eighth resistor R8. A first end of the tenth resistor R10 is coupled to the second end of the eighth resistor R8. A negative input end of the third differential amplifier X3 is coupled to a second end of the ninth resistor R9, and a positive input end of the third differential amplifier X3 is coupled to a second end of the tenth resistor R10. The eleventh resistor R11 is coupled between the negative input end and the output end of the third differential amplifier X3. A positive input end of the fourth comparator X4 is coupled to the output end of the third differential amplifier X3, and a negative input end of the fourth comparator X4 is coupled to a reference voltage providing end. An input end of the second inverter U2 is coupled to an output end of the fourth comparator X4, and an output end of the second inverter U2 is configured as the output end of the current detection circuit 14.

As illustrated in FIG. 4 or 5, the current detection circuit 14 detects the consumption current of the battery through the current detection resistor R8, so that when the voltage jump detection circuit 12 outputs the voltage jump signal, that is, when the first inverter U1 outputs the high level, if the consumption current flowing through the current detection resistor R8 is greater than or equal to the preset current threshold, it indicates that the system load suddenly becomes larger, the voltage of the positive input end the fourth comparator X4 is greater than the reference voltage of the negative input end, and the fourth comparator X4 outputs the high level, and after inverting, the second inverter U2 outputs the low level. The battery protection unit 13 receives both the high level output by the voltage jump detection circuit 12 and the low level output by the current detection circuit 14, and determines that the voltage jump of the battery is for the instantaneous drop of the voltage due to the sudden increase of the system load, but not for the instantaneous drop of the voltage due to the damage of the battery. When the voltage jump detection circuit 12 outputs the voltage jump signal, that is, when the first inverter U1 outputs the high level, if the consumption current flowing through the current detection resistor R8 is less than the preset current threshold, it indicates that the system load does not suddenly increase, the voltage of the positive input end of the fourth comparator X4 is less than the reference voltage of the negative input end, the fourth comparator X4 outputs the low level, and after inverting, the second inverter U2 outputs the high level. The battery protection unit 13 receives both the high level output by the voltage jump detection circuit 12 and the high level output by the current detection circuit 14, and determines that the voltage jump of the battery is for the instantaneous drop of the voltage due to the damage of the battery, but not for the instantaneous drop of the voltage due to the sudden increase of the system load.

Therefore, by introducing the current detection circuit 14, the detection error can be reduced and the judgment accuracy can be improved.

Figure 6:
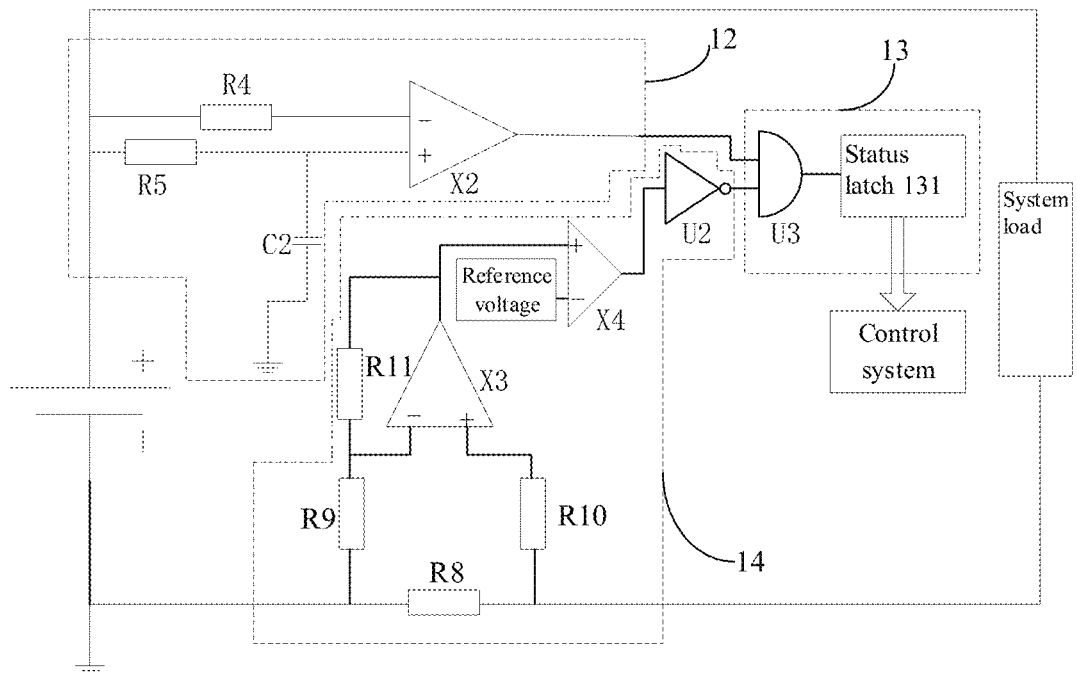
FIG. 6 is a schematic diagram illustrating a circuit of a battery protection board according to another embodiment of the present disclosure.

According to another embodiment of the present disclosure, as illustrated in FIG. 6, the voltage jump detection circuit 12 includes a fourth resistor R4, a fifth resistor R5, a second capacitor C2, and a second differential amplifier X2. A first end of the fourth resistor R4 is coupled to the cathode of the battery. A first end of the fifth resistor R5 is coupled to the cathode of the battery. A first end of the second capacitor C2 is coupled to a second end of the fifth resistor R5 with a second node therebetween, and a second end of the second capacitor C2 is grounded. A negative input end of the second differential amplifier X2 is coupled to a second end of the fourth resistor R4, a positive end of the second differential amplifier X2 is coupled to the second node, and an output end of the second differential amplifier X2 is configured as the output end of the voltage jump detection circuit 12.

Figure 7:
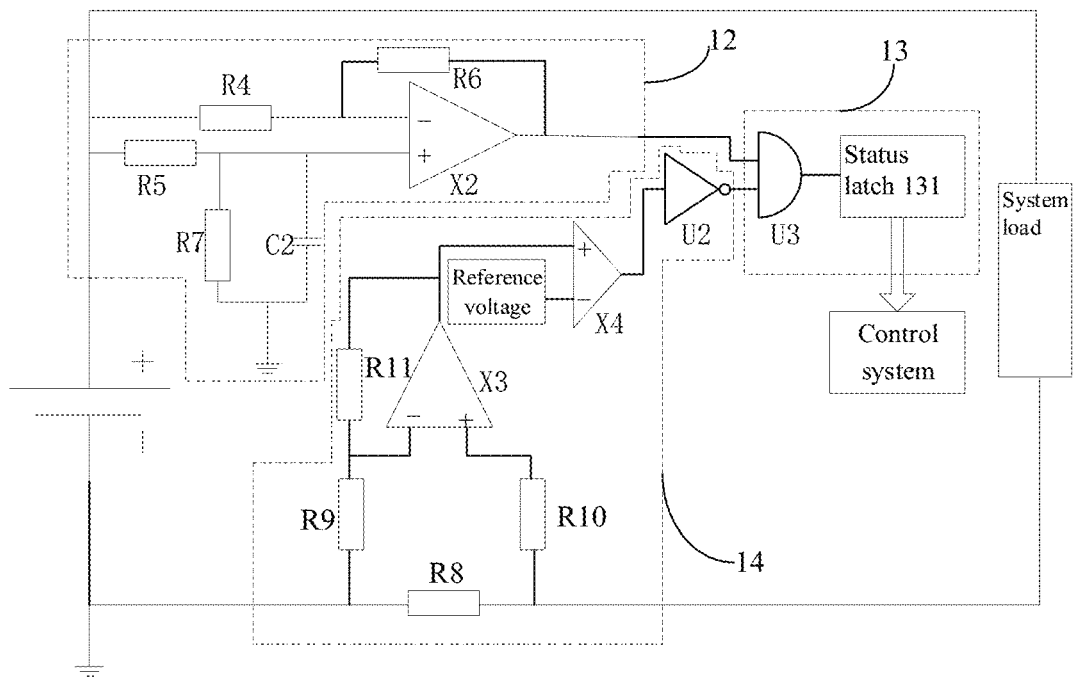
FIG. 7 is a schematic diagram illustrating a circuit of a battery protection board according to another further embodiment of the present disclosure.

Further, in order to improve the reliability and detection precision of the circuit, as illustrated in FIG. 7, the voltage jump detection circuit 12 further includes a sixth resistor R6 and a seventh resistor R7. The sixth resistor R6 is coupled between the negative input end and the output end of the second differential amplifier X2. The second resistor R7 is coupled to the second capacitor C2 in parallel.

When the battery is in normal use, the voltage thereof is relatively stable, the voltages of the positive input end and the negative input end of the second differential amplifier X2 remain stable, and the voltage of the positive input end of the second differential amplifier X2 is greater than the voltage of the negative input end of the second differential amplifier X2, the second differential amplifier X2 continuously outputs a low level. When the battery protection unit 13 receives the low level, the battery protection unit 13 determines that the instantaneous voltage drop does not occur in the battery, and the battery is not damaged and remains in a normal state. When a voltage jump of the battery occurs, due to the presence of the second capacitor C2, the voltage of the positive input end of the second differential amplifier X2 remains constant for a certain period of time, but a voltage jump is generated on the negative input end of the second differential amplifier X2. The second differential amplifier X2 flips and outputs a high level. When the battery protection unit 13 receives the high level, the battery protection unit 13 determines that the battery voltage drops instantaneously, the battery is currently damaged, and there is an abnormality of the battery, and the battery protection unit 13 further protects the battery to prevent the safety hazard.

In an embodiment of the present disclosure, as illustrated in FIG. 6 or 7, the current detection circuit 14 includes an eighth resistor R8, a ninth resistor R9, a tenth resistor R10, a third differential amplifier X3, an eleventh resistor R11, a fourth comparator X4 and a second inverter U2. A first end of the eighth resistor R8 is coupled to the anode of the battery, a second end of the eighth resistor R8 is coupled to the cathode of the battery via a system load, and the eighth resistor R8 is a current detection resistor. A first end of the ninth resistor R9 is coupled to the first end of the eighth resistor R8. A first end of the tenth resistor R10 is coupled to the second end of the eighth resistor R8. A negative input end of the third differential amplifier X3 is coupled to a second end of the ninth resistor R9, and a positive input end of the third differential amplifier X3 is coupled to a second end of the tenth resistor R10. The eleventh resistor R11 is coupled between the negative input end and the output end of the third differential amplifier X3. A positive input end of the fourth comparator X4 is coupled to the output end of the third differential amplifier X3, and a negative input end of the fourth comparator X4 is coupled to a reference voltage providing end. An input end of the second inverter U2 is coupled to an output end of the fourth comparator X4, and an output end of the second inverter U2 is configured as the output end of the current detection circuit 14.

As illustrated in FIG. 6 or 7, the current detection circuit 14 detects the consumption current of the battery through the current detection resistor R8, so that when the voltage jump detection circuit 12 outputs the voltage jump signal, that is, when the first inverter U1 outputs the high level, if the consumption current flowing through the current detection resistor R8 is greater than or equal to the preset current threshold, it indicates that the system load suddenly becomes larger, the voltage of the positive input end the fourth comparator X4 is greater than the reference voltage of the negative input end, and the fourth comparator X4 outputs the high level, and after inverting, the second inverter U2 outputs the low level. The battery protection unit 13 receives both the high level output by the voltage jump detection circuit 12 and the low level output by the current detection circuit 14, and determines that the voltage jump of the battery is for the instantaneous drop of the voltage due to the sudden increase of the system load, but not for the instantaneous drop of the voltage due to the damage of the battery. When the voltage jump detection circuit 12 outputs the voltage jump signal, that is, when the first inverter U1 outputs the high level, if the consumption current flowing through the current detection resistor R8 is less than the preset current threshold, it indicates that the system load does not suddenly increase, the voltage of the positive input end of the fourth comparator X4 is less than the reference voltage of the negative input end, the fourth comparator X4 outputs the low level, and after inverting, the second inverter U2 outputs the high level. The battery protection unit 13 receives both the high level output by the voltage jump detection circuit 12 and the high level output by the current detection circuit 14, and determines that the voltage jump of the battery is for the instantaneous drop of the voltage due to the damage of the battery, but not for the instantaneous drop of the voltage due to the sudden increase of the system load.

Therefore, by introducing the current detection circuit 14, the detection error can be reduced and the judgment accuracy can be improved.

According to an embodiment of the present disclosure, as illustrated in FIG. 4, 5, 6, or 7, the battery protection unit 13 includes an AND gate U3 and a status latch 131. A first input end of the AND gate U3 is coupled to the output end of the voltage jump detection circuit 12, a second input end of the AND gate U3 is coupled to the output end of the current detection circuit 14, and the AND gate U3 is configured to perform an AND operation on the voltage jump signal and the low current signal to output a status signal indicating the occurrence of voltage jump. The status latch 131 is coupled to the output end of the AND gate U3, and is configured to latch the status of the battery in which the voltage jump occurs according to the status signal, and to protect the battery based on the status of the battery when the voltage jump occurs.

That is, when the high level output by the voltage jump detection circuit 12 and the low level output by the current detection circuit 14 are received by the AND gate U3, the AND gate U3 outputs the high level. When the status latch 131 receives the high level, the status latch 131 latches the status of the battery in which the voltage jump occurs, so that other control circuits may read the state information of the battery in which the voltage jump occurs, and further determine that the instantaneous voltage drop of the battery due to the damage has come up before, and determine that there is abnormality in the battery, such that the battery can be effectively and safely protected against potential safety hazards and the safe use of the battery can be further ensured.

In embodiments of the present disclosure, the inventors have found through extensive tests and experiments that the voltage of the battery is relatively stable during normal use, but once the battery is subjected to external mechanical damage such as falling, impacting, squeezing and puncturing, a voltage jump of the battery occurs. Therefore, the battery protection board of embodiments of the present disclosure monitors whether the battery is damaged by detecting through the voltage jump detection circuit 12 whether a voltage jump of the battery occurs. Once the voltage jump of the battery voltage is detected, it indicates that the battery is damaged and an internal short circuit occurs, and it is determined that the battery is currently abnormal, and has a certain safety hazard.

Figure 8:
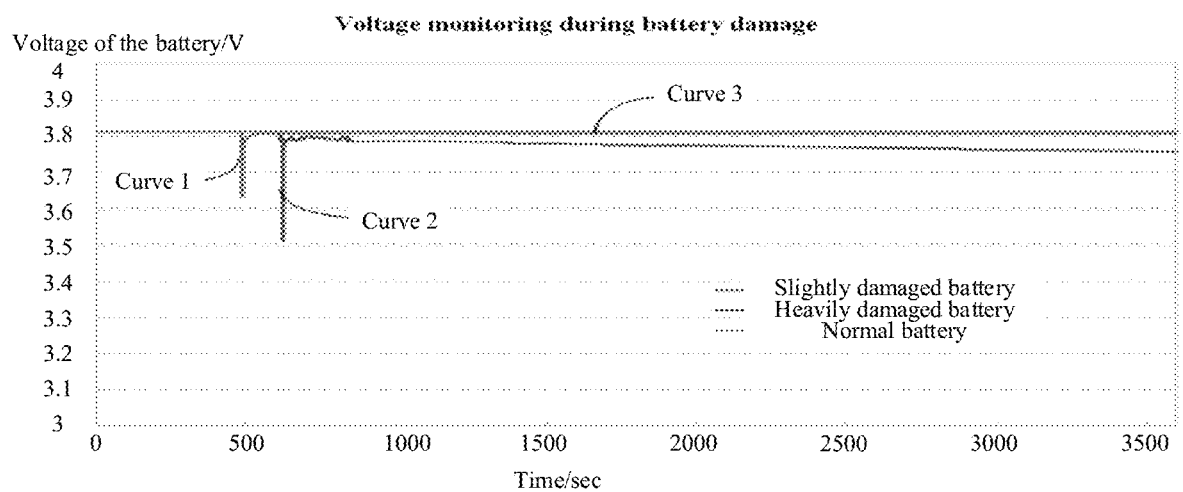
FIG. 8 is a schematic diagram illustrating a comparison of voltage monitoring curves of a damaged battery and a normal battery according to an embodiment of the present disclosure.

Specifically, according to an embodiment of the present disclosure, voltage monitoring in the damage process of the battery is as illustrated in FIG. 8. Curve 1 represents the voltage change of the battery when the battery is slightly damaged, curve 2 represents the voltage change of the battery when the battery is seriously damaged, and curve 3 represents the voltage change of a normal battery without damage. It can be seen from curve 1 that, when the battery is slightly damaged, the battery voltage instantaneously drops from 3.8V to 3.63V and then back to about 3.8V. As can be seen from curve 2 that, when the battery is seriously damaged, the battery voltage instantaneously drops from 3.8V to 3.51V and then back to about 3.8V. As can be seen from curve 3 that, when the battery is normal and not damaged, the battery voltage is basically stable at 3.8V. Therefore, by comparing curve 1, curve 2 and curve 3, it can be seen that once the battery is subjected to external mechanical damages such as falling, impacting, squeezing and penetrating, the voltage jump of the battery occurs, that is, the voltage of the battery suddenly drops, and the magnitude of the voltage drop is different depending on the degree of damage. The battery protection board of embodiments of the present disclosure monitors whether the battery is damaged currently by detecting whether an instantaneous voltage drop of the battery voltage occurs. Once the instantaneous drop of the battery voltage is detected, it is determined that the battery is damaged currently and an internal short circuit occurs, and it is determined that the battery is currently abnormal and has a certain safety hazard, thereby protecting the battery effectively.

According to an embodiment of the present disclosure, the status latch 131 is further configured to send the status of the battery in which the voltage jump occurs, to a control system 20, and the control system 20 is configured to determine that the battery is abnormal according to the status of the battery in which the voltage jump occurs.

The control system 20 may be a main control of the electronic device, and the main control further controls the electronic device to issue a reminder message indicating an abnormality of the battery when determining that the battery is abnormal.

Therefore, the battery protection board of embodiments of the present disclosure determines whether the battery is damaged by detecting through the voltage jump detection circuit whether a voltage jump of the battery voltage occurs, so that the battery can be monitored in real time once the battery is damaged, and the battery can be protected effectively, and moreover timely reminder and maintenance can be achieved, thereby avoiding the safety hazards caused by the abnormal battery and greatly improving the safety of the electronic device in use.

Figure 9:
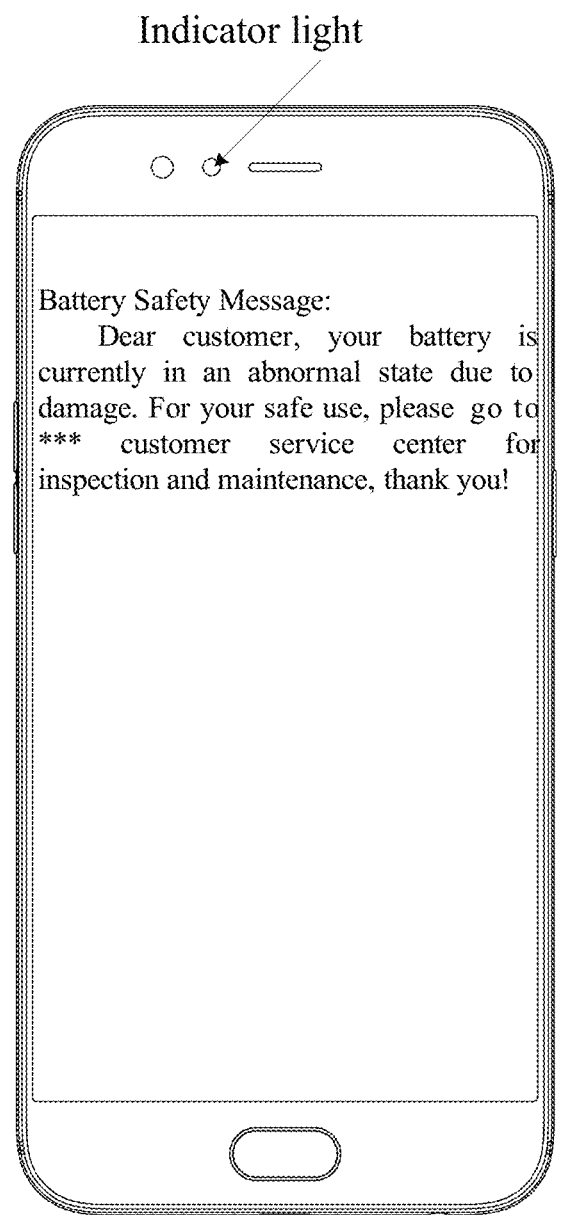
FIG. 9 is a schematic diagram of a reminder message of a mobile terminal according to an embodiment of the present disclosure.

For example, when the main control of the electronic device determines that the battery is abnormal, it alerts the user. As an example, as illustrated in FIG. 9, the users can be alerted by the following message "Battery Safety Message: Dear customer, your battery is currently in an abnormal state due to damage. For your safe use, please go to * customer service center for inspection and maintenance, thank you!" As another example, while displaying the message as illustrated in FIG. 9** to alert the user, the user may also be altered by flashing the indicator light disposed on the mobile terminal, for example, controlling the indicator light to emit red light at a high frequency. As yet another example, the user may also be alerted by the voice playing function in the electronic device.

In general, when seeing the above reminder message, the user will promptly go to the corresponding customer service center for inspection and maintenance. However, some users are not sure about the seriousness of the problem when they see the message, so it is likely for them to ignore the message, and continue to use the electronic device. In this case, the user should be alerted repeatedly, for example, at least three times. If the user still does not seek for maintenance after a plurality of reminder, some functions of the electronic device can be limited.

For example, in general, the lower the power consumption of an application in the electronic device is, the less heat is generated when the battery is used. For example, when the chatting application is activated, but the video chat is not performed, the battery power consumption is small at this time and the battery generates less heat, and thus the battery is less likely to cause safety incidents. When the application consumes a large amount of power, for example, by watching videos and playing games, the battery power consumption is large at this time and the battery generates more heat, and thus the battery is likely to cause safety incidents. Therefore, when it is determined that there is an abnormality in the battery, certain applications such as video software and game software that consume a large amount of power shall be banned, or the entire system can be directly prohibited to prevent the occurrence of safety incidents, and the message "The battery has potential safety hazard, the activation of system is prohibited, please go to the customer service center of *** for inspection and maintenance, thank you for your cooperation!" could be displayed on the screen of the electronic device to remind the user, or the system may be controlled to shut down, and cannot be started.

In addition, heat is also generated during the charging process of the battery. In particular, in the state of fast charging, more heat is generated in a short time. When it is determined that the battery is abnormal, the battery is also prohibited from fast charging. In severe cases, the user may be banned from charging the battery to prevent safety incidents, and the user will be alerted through the message displayed on the screen of the electronic device "The battery is damaged and cannot be charged. Please check the customer service center of *** for inspection and maintenance, thank you for your cooperation!"

In conclusion, according to the battery protection board of embodiments of the present disclosure, the voltage jump detection circuit is disposed on the body to detect whether the voltage jump occurs in the voltage of the battery and to output the voltage jump signal to the battery protection unit when the voltage jump occurs in the battery voltage. When receiving the voltage jump signal, the battery protection unit determines that the battery is damaged, and effectively protects the battery to avoid potential safety hazards due to battery damage. In other words, when the battery is currently damaged, the voltage jump of the battery voltage occurs. The battery protection board of embodiments of the present disclosure determines whether there is an abnormality in the battery currently by detecting whether the voltage jump of the battery voltage occurs, so that the battery abnormality can be monitored in real time once the battery is damaged, and the battery can be protected effectively, and moreover timely reminder and maintenance can be achieved, thereby avoiding safety hazard caused by the battery abnormality, and greatly improving the safety of the electronic device in use.

Figure 10:
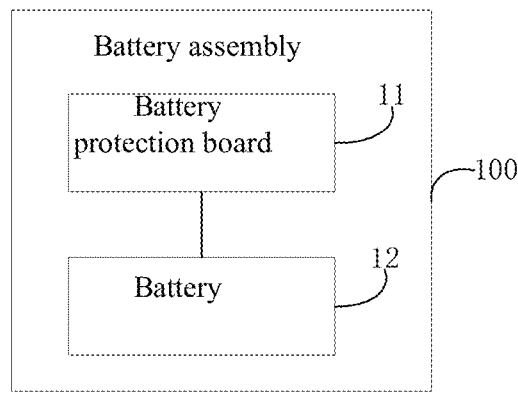
FIG. 10 is a schematic block diagram of a battery assembly according to an embodiment of the present disclosure.

As illustrated in FIG. 10, embodiments of the present disclosure further provide a battery assembly 100. The battery assembly 100 includes a battery 12 and the battery protection board 11 described above.

Moreover, the battery 12 includes a battery cell, which will not be described in detail herein.

With the above battery protection board, the battery assembly according to embodiments of the present disclosure may determine whether the battery is abnormal by detecting whether the voltage jump occurs in the voltage of the battery, so that the battery abnormality can be monitored in real time once the battery is damaged, and the battery can be protected effectively, and moreover timely reminder and maintenance can be achieved, thereby avoiding safety hazard caused by the battery abnormality, and greatly improving the safety of the electronic device in use.

Figure 11:
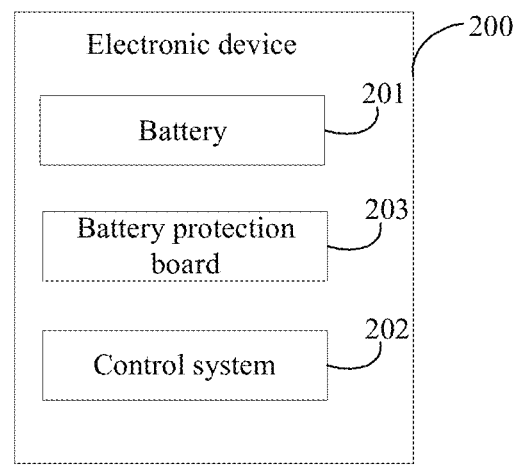
FIG. 11 is a schematic block diagram of an electronic device according to an embodiment of the present disclosure.

Further, as illustrated in FIG. 11, embodiments of the present disclosure further provide an electronic device 200. The electronic device 200 includes a battery 201, a control system 202 and a battery protection circuit 203.

With respect to the battery protection circuit 203 and the battery 201, reference may be made to the above description, which will not be elaborated here.

The control system 202 is coupled to the battery protection circuit 203, and is configured to control the electronic device 200 to issue an alert when the battery 201 is damaged.

The electronic device according to embodiments of the present disclosure can determine whether the battery is abnormal by detecting whether the voltage jump occurs in the voltage of the battery, so that the battery abnormality can be monitored in time once the battery is damaged, and the battery can be protected effectively, and moreover timely reminder and maintenance can be achieved, thereby avoiding safety hazard caused by battery abnormality, and greatly improving the safety of the electronic device in use.

In the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anti-clockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "coupled," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

Those skilled in the art will appreciate that the elements and algorithm steps of the various examples described in combination with the embodiments disclosed herein can be implemented in electronic hardware or a combination of computer software and electronic hardware. Whether these functions are implemented by hardware or software depends on the specific application and restrictive conditions on design. A person skilled in the art can use different methods for implementing the described functions for each particular application, but such implementation should not be considered to be beyond the scope of the present invention.

A person skilled in the art can clearly understand that for the convenience and brevity of the description, the specific working process of the system, the device and the unit described above can refer to the corresponding process in the above method embodiment, and details are not described herein again.

In several embodiments provided by the present disclosure, it should be understood that, the system, devices and method disclosed in several embodiments provided by the present disclosure can be realized in any other manner. For example, the device embodiments described above can be merely exemplary, for example, the units are just divided according to logic functions. In practical implementation, the units can be divided in other manners, for example, multiple units or components can be combined or integrated into another system, or some features can be omitted or not executed. In addition, the mutual coupling or direct coupling or communication connection described or discussed can be via some interfaces, and indirect coupling or communication connection between devices or units may be electrical, mechanical or of other forms.

The units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure In addition, respective functional units in respective embodiments of the present disclosure can be integrated into one processing unit, or can be present as separate physical entities. It is also possible that two or more than two units are integrated into one unit.

If the functions are realized in form of functional software units and are sold or used as separate products, they can be stored in a computer readable storage medium. Based on this understanding, the parts of the technical solutions or the essential parts of the technical solutions (i.e. the parts making a contribution to the related art) can be embodied in form of software product, which is stored in a storage medium, and includes several instruction used for causing a computer device (for example, a personal computer, a server or a network device) to execute all or part of steps in the methods described in respective embodiments of the present disclosure. The above storage medium may be any medium capable of storing program codes, including a USB flash disk, a mobile hard disk, a Read-Only Memory (ROM), a Random Access Memory (RAM), a disc, or a light disk.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An electronic battery protection board implemented on a printed circuit board, comprising:
    a body;
    a voltage jump detection circuit, disposed on the body, and configured to detect whether a sudden voltage change as a voltage jump occurs in a voltage of a battery, and to generate a voltage jump signal when a voltage jump occurs in the voltage of the battery;
    a battery protection unit, coupled to an output end of the voltage jump detection circuit, and configured to determine that the battery is damaged when the voltage jump signal is received, and to protect the battery;
    a current detection circuit, disposed on the body, and configured to detect a consumption current of the battery, and to output a low current signal to the battery protection unit when the consumption current of the battery is lower than a preset current threshold, such that the battery protection unit determines that the battery is damaged according to the low current signal and the voltage jump signal;
    an AND gate, wherein a first input end of the AND gate is coupled to the output end of the voltage jump detection circuit, a second input end of the AND gate is coupled to the output end of the current detection circuit, and the AND gate is configured to perform an AND operation on the voltage jump signal and the low current signal to output a status signal indicating an occurrence of the voltage jump; and a status latch, coupled to an output end of the AND gate, and configured to latch a status of the battery in which the voltage jump occurs according to the status signal, and to protect the battery based on the status of the battery in which the voltage jump occurs.

2. The electronic battery protection board of claim 1, wherein the voltage jump detection circuit comprises:
a first resistor, wherein a first end of the first resistor is coupled to a cathode of the battery;
a first capacitor, wherein a first end of the first capacitor is coupled to a second end of the first resistor with a first node therebetween, and a second end of the first capacitor is grounded;
a first differential amplifier, wherein a negative input end of the first differential amplifier is coupled to the first node, and a positive input end of the first differential amplifier is coupled to the cathode of the battery; and
a first inverter, wherein an input end of the first inverter is coupled to an output end of the first differential amplifier, and an output end of the first inverter is configured as the output end of the voltage jump detection circuit.

3. The electronic battery protection board of claim 2, wherein the voltage jump detection circuit further comprises:
a second resistor, coupled to the first capacitor in parallel; and
a third resistor, wherein a first end of the third resistor is coupled to the cathode of the battery, and a second end of the third resistor is coupled to the positive input end of the first differential amplifier.

4. The electronic battery protection board of claim 1, wherein the voltage jump detection circuit comprises:
a fourth resistor, wherein a first end of the fourth resistor is coupled to a cathode of the battery;
a fifth resistor, wherein a first end of the fifth resistor is coupled to the cathode of the battery;
a second capacitor, wherein a first end of the second capacitor is coupled to a second end of the fifth resistor with a second node therebetween, and a second end of the second capacitor is grounded; and
a second differential amplifier, wherein a negative input end of the second differential amplifier is coupled to a second end of the fourth resistor, a positive input end of the second differential amplifier is coupled to the second node, and an output end of the second differential amplifier is configured as the output end of the voltage jump detection circuit.

5. The electronic battery protection board of claim 4, wherein the voltage jump detection circuit further comprises:
a sixth resistor, coupled between the negative input end and the output end of the second differential amplifier; and
a seventh resistor, coupled to the second capacitor in parallel.

6. The electronic battery protection board of claim 1, wherein the current detection circuit comprises:

an eighth resistor, wherein a first end of the eighth resistor is coupled to an anode of the battery, and a second end of the eighth resistor is coupled to a cathode of the battery via a system load;
a ninth resistor, wherein a first end of the ninth resistor is coupled to the first end of the eighth resistor;
a tenth resistor, wherein a first end of the tenth resistor is coupled to the second end of the eighth resistor;
a third differential amplifier, wherein a negative input end of the third differential amplifier is coupled to a second end of the ninth resistor, and a positive input end of the third differential amplifier is coupled to a second end of the tenth resistor;
an eleventh resistor, coupled between the negative input end and the output end of the third differential amplifier;
a fourth comparator, wherein a positive input end of the fourth comparator is coupled to the output end of the third differential amplifier, and a negative input end of the fourth comparator is coupled to a reference voltage providing end; and
a second inverter, wherein an input end of the second inverter is coupled to an output end of the fourth comparator, and an output end of the second inverter is configured as the output end of the current detection circuit.

7. The electronic battery protection board of claim 1, wherein the status latch is further configured to send the status of the battery in which the voltage jump occurs to a control system, and the control system is configured to determine that the battery is abnormal according to the status of the battery in which the voltage jump occurs.

8. The electronic battery protection board of claim 7, wherein the control system is a main control of an electronic device, and the main control is further configured to control the electronic device to output a reminder message indicating an abnormality of the battery when determining that the battery is abnormal.

9. A battery assembly, comprising:
a battery;
an electronic battery protection board implemented on a printed circuit board, comprising:
a body;
a voltage jump detection circuit, disposed on the body, and configured to detect whether a sudden voltage change as a voltage jump occurs in a voltage of the battery, and to generate a voltage jump signal when a voltage jump occurs in the voltage of the battery;
a battery protection unit, coupled to an output end of the voltage jump detection circuit, and configured to determine that the battery is damaged when the voltage jump signal is received, and to protect the battery;
a current detection circuit, disposed on the body, and configured to detect a consumption current of the battery, and to output a low current signal to the battery protection unit when the consumption current of the battery is lower than a preset current threshold, such that the battery protection unit determines that the battery is damaged according to the low current signal and the voltage jump signal;
an AND gate, wherein a first input end of the AND gate is coupled to the output end of the voltage jump detection circuit, a second input end of the AND gate is coupled to the output end of the current detection circuit, and the AND gate is configured to perform an AND operation on the voltage jump signal and the low current signal to output a status signal indicating an occurrence of the voltage jump; and a status latch, coupled to an output end of the AND gate, and configured to latch a status of the battery in which the voltage jump occurs according to the status signal, and to protect the battery based on the status of the battery in which the voltage jump occurs.

10. An electronic device, comprising:

a battery;

an electronic battery protection board implemented on a printed circuit board, comprising:

a body;

a voltage jump detection circuit, disposed on the body, and configured to detect whether a sudden voltage change as a voltage jump occurs in a voltage of the battery, and to generate a voltage jump signal when a voltage jump occurs in the voltage of the battery;

a battery protection unit, coupled to an output end of the voltage jump detection circuit, and configured to determine that the battery is damaged when the voltage jump signal is received, and to protect the battery;

a current detection circuit, disposed on the body, and configured to detect a consumption current of the battery, and to output a low current signal to the battery protection unit when the consumption current of the battery is lower than a preset current threshold, such that the battery protection unit determines that the battery is damaged according to the low current signal and the voltage jump signal;

an AND gate, wherein a first input end of the AND gate is coupled to the output end of the voltage jump detection circuit, a second input end of the AND gate is coupled to the output end of the current detection circuit, and the AND gate is configured to perform an AND operation on the voltage jump signal and the low current signal to output a status signal indicating an occurrence of the voltage jump; and a status latch, coupled to an output end of the AND gate, and configured to latch a status of the battery in which the voltage jump occurs according to the status signal, and to protect the battery based on the status of the battery in which the voltage jump occurs; and a control system, coupled to the battery protection board, and configured to issue an alert when the battery is damaged.

11. The battery assembly of claim 9, wherein the voltage jump detection circuit comprises:

a first resistor, wherein a first end of the first resistor is coupled to a cathode of the battery;

a first capacitor, wherein a first end of the first capacitor is coupled to a second end of the first resistor with a first node therebetween, and a second end of the first capacitor is grounded;

a first differential amplifier, wherein a negative input end of the first differential amplifier is coupled to the first node, and a positive input end of the first differential amplifier is coupled to the cathode of the battery; and a first inverter, wherein an input end of the first inverter is coupled to an output end of the first differential amplifier, and an output end of the first inverter is configured as the output end of the voltage jump detection circuit.

12. The battery assembly of claim 11, wherein the voltage jump detection circuit further comprises:

a second resistor, coupled to the first capacitor in parallel; and a third resistor, wherein a first end of the third resistor is coupled to the cathode of the battery, and a second end of the third resistor is coupled to the positive input end of the first differential amplifier.

13. The battery assembly of claim 9, wherein the voltage jump detection circuit comprises:

a fourth resistor, wherein a first end of the fourth resistor is coupled to a cathode of the battery;

a fifth resistor, wherein a first end of the fifth resistor is coupled to the cathode of the battery;

a second capacitor, wherein a first end of the second capacitor is coupled to a second end of the fifth resistor with a second node therebetween, and a second end of the second capacitor is grounded; and a second differential amplifier, wherein a negative input end of the second differential amplifier is coupled to a second end of the fourth resistor, a positive input end of the second differential amplifier is coupled to the second node, and an output end of the second differential amplifier is configured as the output end of the voltage jump detection circuit.

14. The battery assembly of claim 13, wherein the voltage jump detection circuit further comprises:

a sixth resistor, coupled between the negative input end and the output end of the second differential amplifier; and a seventh resistor, coupled to the second capacitor in parallel.

15. The electronic device of claim 10, wherein the current detection circuit comprises:

an eighth resistor, wherein a first end of the eighth resistor is coupled to an anode of the battery, and a second end of the eighth resistor is coupled to a cathode of the battery via a system load;

a ninth resistor, wherein a first end of the ninth resistor is coupled to the first end of the eighth resistor;

a tenth resistor, wherein a first end of the tenth resistor is coupled to the second end of the eighth resistor;

a third differential amplifier, wherein a negative input end of the third differential amplifier is coupled to a second end of the ninth resistor, and a positive input end of the third differential amplifier is coupled to a second end of the tenth resistor;

an eleventh resistor, coupled between the negative input end and the output end of the third differential amplifier;

a fourth comparator, wherein a positive input end of the fourth comparator is coupled to the output end of the third differential amplifier, and a negative input end of the fourth comparator is coupled to a reference voltage providing end; and a second inverter, wherein an input end of the second inverter is coupled to an output end of the fourth comparator, and an output end of the second inverter is configured as the output end of the current detection circuit.

16. The electronic device of claim 10, wherein the status latch is further configured to send the status of the battery in which the voltage jump occurs to a control system, and the control system is configured to determine that the battery is abnormal according to the status of the battery in which the voltage jump occurs.

* * * * *